(12) United States Patent
Kim

(10) Patent No.: US 7,892,959 B2
(45) Date of Patent: Feb. 22, 2011

(54) METHOD OF MANUFACTURING FLASH MEMORY DEVICE WITH REDUCED VOID GENERATION

(75) Inventor: Sung-Jin Kim, Busan (KR)

(73) Assignee: Dongbu HiTek Co., Ltd., Seoul (KR)

( * ) Notice: Subject to any disclaimer, the term of this patent is extended or adjusted under 35 U.S.C. 154(b) by 137 days.

(21) Appl. No.: 12/146,183

(22) Filed: Jun. 25, 2008

(65) Prior Publication Data

US 2009/0023278 A1      Jan. 22, 2009

(30) Foreign Application Priority Data

Jun. 26, 2007      (KR) ...................... 10-2007-0062649

(51) Int. Cl.
*H01L 21/3205*      (2006.01)
*H01L 21/4763*      (2006.01)

(52) U.S. Cl. ................ 438/591; 438/595; 257/E21.625

(58) Field of Classification Search ............ 257/E21.21, 257/E21.626, E21.64, 900, 336, 344; 438/238, 438/241, 257, 258, 303, 305, 591, 595, 184
See application file for complete search history.

(56) References Cited

U.S. PATENT DOCUMENTS

| | | | | |
|---|---|---|---|---|
| 6,740,247 | B1 * | 5/2004 | Han et al. ...................... | 216/73 |
| 7,510,923 | B2 * | 3/2009 | Mehrotra et al. ............ | 438/184 |
| 2003/0119273 | A1 * | 6/2003 | Aggarwal et al. ........... | 438/396 |
| 2004/0180504 | A1 * | 9/2004 | Lee et al. ..................... | 438/303 |
| 2004/0209472 | A1 * | 10/2004 | Clementi et al. ............ | 438/689 |
| 2006/0014351 | A1 * | 1/2006 | Lo et al. ...................... | 438/305 |
| 2007/0015317 | A1 * | 1/2007 | Lee ............................. | 438/142 |
| 2007/0072373 | A1 * | 3/2007 | Lee ............................. | 438/257 |
| 2007/0184606 | A1 * | 8/2007 | You et al. .................... | 438/211 |
| 2007/0241386 | A1 * | 10/2007 | Wang et al. .................. | 257/314 |
| 2009/0039426 | A1 * | 2/2009 | Cartier et al. ................ | 257/344 |

OTHER PUBLICATIONS

John L. Vossen and Werner Kern eds., "Thin Film Processes II", 1991, Academic Press, p. 320.*

* cited by examiner

*Primary Examiner*—Chuong A Luu
*Assistant Examiner*—Nga Doan
(74) *Attorney, Agent, or Firm*—Sherr & Vaughn, PLLC

(57) ABSTRACT

A method of manufacturing a flash memory device that may include forming a first oxide film pattern and a first polysilicon pattern on a semiconductor substrate; sequentially forming a dielectric film pattern and a second polysilicon pattern on the semiconductor substrate including the first oxide film pattern and the first polysilicon pattern; forming a second oxide film pattern on the second polysilicon pattern; forming a gate by etching to the semiconductor substrate using the second oxide film pattern as a mask, the gate including the first oxide film pattern, the first polysilicon pattern, the dielectric film pattern and the second polysilicon pattern; removing the second oxide film pattern; forming a spacer on sidewalls of the gate; and forming an interlayer dielectric film on the semiconductor substrate including the gate and the spacer.

13 Claims, 15 Drawing Sheets

(a) 130nm technology  (b) 90nm technology

METHOD OF MANUFACTURING FLASH MEMORY DEVICE WITH REDUCED VOID GENERATION

The present application claims priority under 35 U.S.C. §119 to Korean Patent Application No. 10-2007-0062649 (filed on Jun. 26, 2007), which is hereby incorporated by reference in its entirety.

BACKGROUND

Flash memory devices are non-volatile memory media that do not damage stored data even though power is turned off. Flash memory devices are advantageous in having relatively high processing speed such as recording, reading, and deleting, etc. Therefore, flash memory devices have been widely used in data storage for BIOS of PC, a set-top box, a printer, and a network server, etc. Flash memory devices have recent application in devices such as digital cameras, cellular phones, etc. However, as requirements for highly-integrated devices increase, the size of a unit cell of the flash memory device is reduced and a spatial interval between gate areas forming the unit cell is also reduced so that voids are generated when forming a metal wire.

Figure 1:
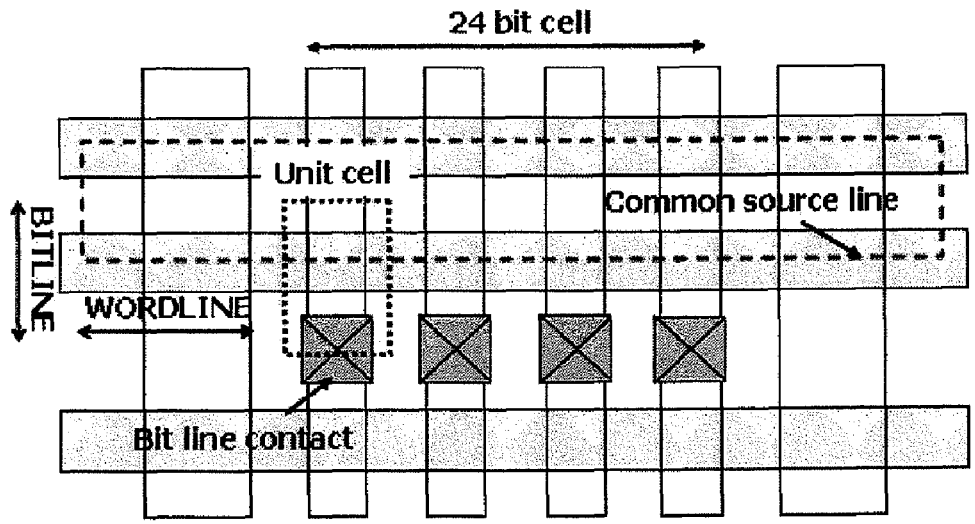

As illustrated in example FIG. 1, a structure of 90 nm flash cells may have bit lines sharing a common source line, the bit lines being configured of 24 bit cells such that unit cells have a horizontal length including cell gates and a vertical length including bit line contacts.

Figure 2:
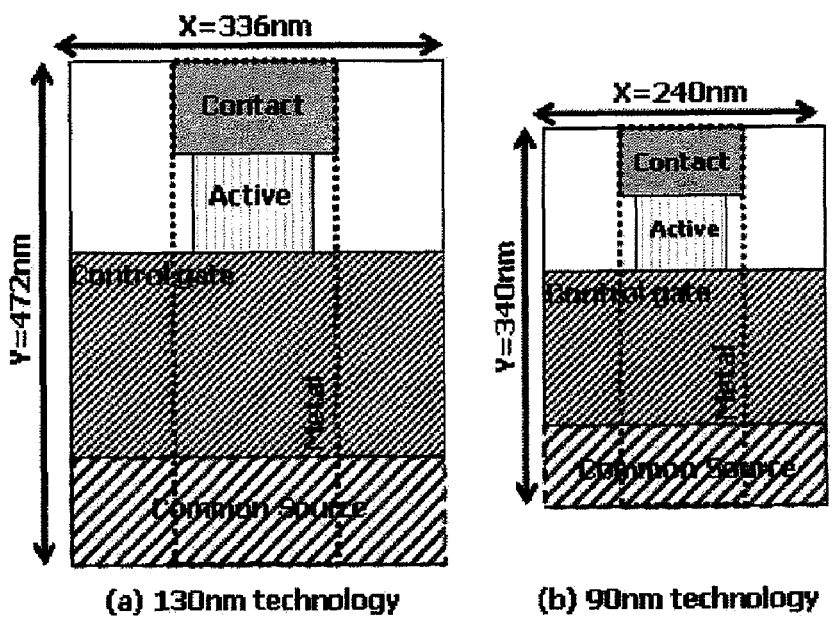

As illustrated in example FIGS. 2(a) and 2(b), a 90 nm NOR flash cell may have a cell size of 0.081 $\mu m^2$ reduced by about 49% than a 130 nm flash cell. Such a reduction in a cell size may cause problems such as difficulty in patterning important processes forming cells and the generation of voids at the time of gap filling.

SUMMARY

Embodiments relate to a method of manufacturing a flash memory device that can prevent generation of voids when forming a device isolation film and generation of voids when forming an interlayer dielectric film.

Embodiments relate to a method of manufacturing a flash memory device that may include at least one of the following steps: forming a dielectric film pattern on and/or over a semiconductor substrate; and then etching the semiconductor substrate using the dielectric film pattern as a mask to form a trench; and then forming a first dielectric film on and/or over the semiconductor substrate including the trench; and then performing a wet etching process on the semiconductor substrate formed with the first dielectric film; and then forming a second dielectric film on and/or over the semiconductor substrate; and then performing a planarization process on the first and second dielectric films; and then removing the dielectric film pattern.

Embodiments relate to a method of manufacturing a flash memory device that can include at least one of the following steps: forming a first oxide film pattern and a first poly silicon pattern on and/or over a semiconductor substrate; and then sequentially stacking a dielectric film and a second poly silicon on and/or over the semiconductor substrate formed with the first oxide film pattern and the first poly silicon pattern; and then forming a second oxide film pattern on and/or over the second poly silicon; and then etching the semiconductor substrate using the second oxide film pattern as a mask to form a gate configured of the first oxide film, the first poly silicon pattern, the dielectric film pattern and the second poly silicon pattern; and then removing the second oxide film pattern; and then forming a spacer on and/or over sidewalls of the gate; and then forming an interlayer dielectric film on and/or over the semiconductor substrate formed with the gate and the spacer.

DRAWINGS

Example FIG. 1 illustrates a structure of an entire arrangement of 90 nm flash cells.

Example FIGS. 2(a) and 2(b) illustrate a layout of unit cells in 130 nm and 90 nm processes.

Example FIGS. 3 to 21 illustrate a method of manufacturing a flash memory device, in accordance with embodiments.

Example FIGS. 22 to 31 illustrate experimental results drawing optimal cell property through process experiments affecting cell property.

Example FIGS. 30 to 33 illustrate experimental results testing reliability of cells.

DESCRIPTION

Hereinafter, a method of manufacturing a flash memory device, in accordance with embodiments will be described with reference to the accompanying drawings.

Figure 3:
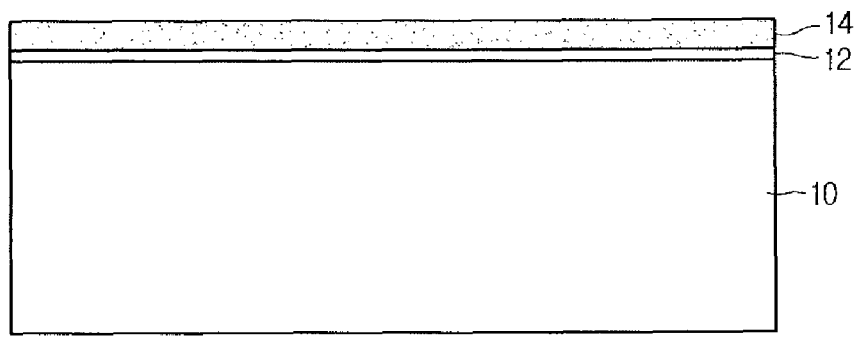

As illustrated in example FIG. 3, first gate oxide film 12 may be formed on and/or over semiconductor substrate 10 to protect a device formed on and/or over semiconductor substrate 10. First nitride film 14 may then be formed on and/or over first gate oxide 12. First nitride film 14 may be composed of a silicon nitride film or an oxynitride film.

Figure 4:
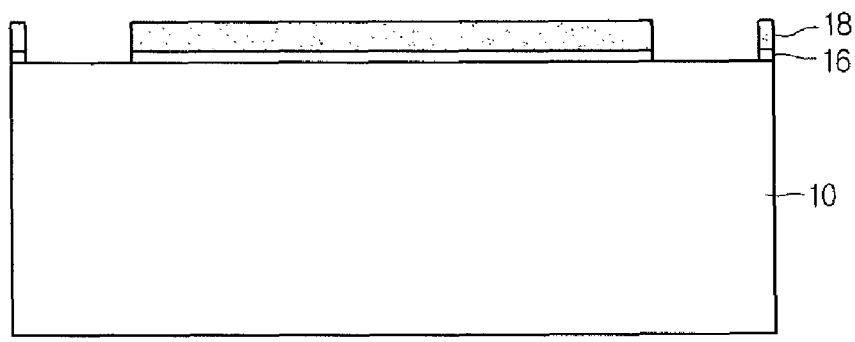

As illustrated in example FIG. 4, first gate oxide film 12 and first nitride film 14 may then be patterned exposing semiconductor substrate 10 while forming first gate oxide film pattern 16 and first nitride film pattern 18. First gate oxide film pattern 16 and first nitride film pattern 18 may be formed by forming a photoresist pattern on and/or over first nitride film pattern 14 through an exposure process and a development process and then by performing an etching process thereon to thereby expose semiconductor substrate 10 in a device isolation region.

Figure 5:
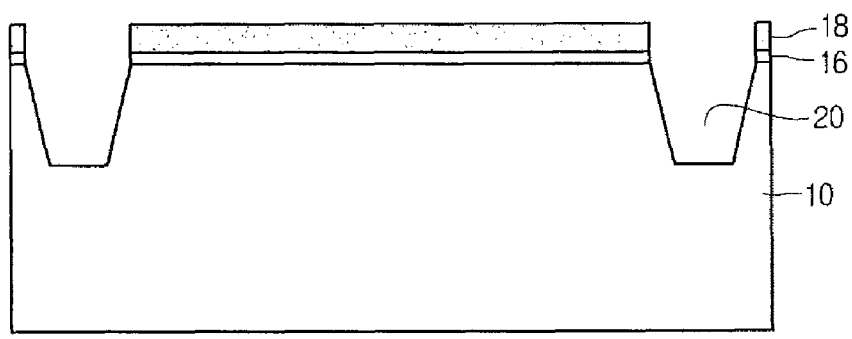

As illustrated in example FIG. 5, an etching process may then be performed on semiconductor substrate 10 using first gate oxide film pattern 16 and first nitride film patter 18 as masks to form trench 20.

Figure 6:
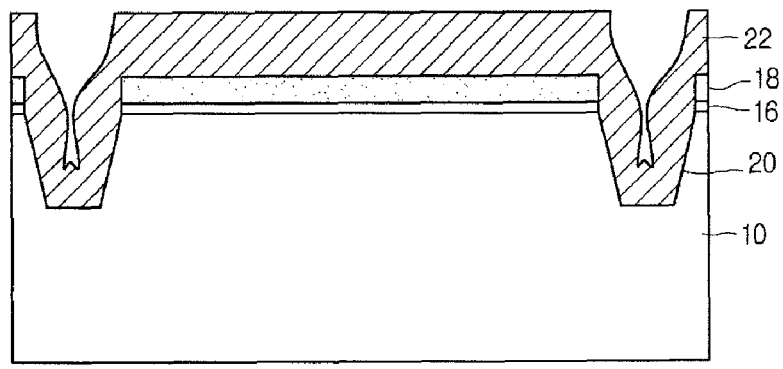

As illustrated in example FIG. 6, first dielectric film 22 may then be formed on and/or over semiconductor substrate 10 and buried in trench 20. When forming first dielectric film 22, first dielectric film 22 may be projected on and/or over an uppermost surface of trench 20, generating an overhang. First dielectric film 22 may be composed of high density plasma undoped silicate glass (HDP USG) having a thickness in a range between 700 to 2150 Å.

Figure 7:
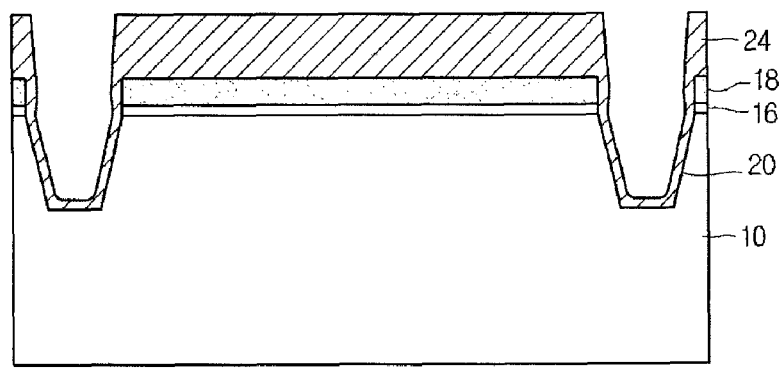

As illustrated in example FIG. 7, the projected portion of first dielectric film 22 may then be removed to form first dielectric film pattern 24. The projected portion of first dielectric film 22 may be removed through a wet etching using diluted hydrogen fluoride (DHF) solution, such that first dielectric film 24 remains at a thickness in a range between 1350 to 1840 Å. The projected portion on and/or over the uppermost surface of trench 20 may be removed through the wet etching, making it possible to increase aspect ratio.

Figure 8:
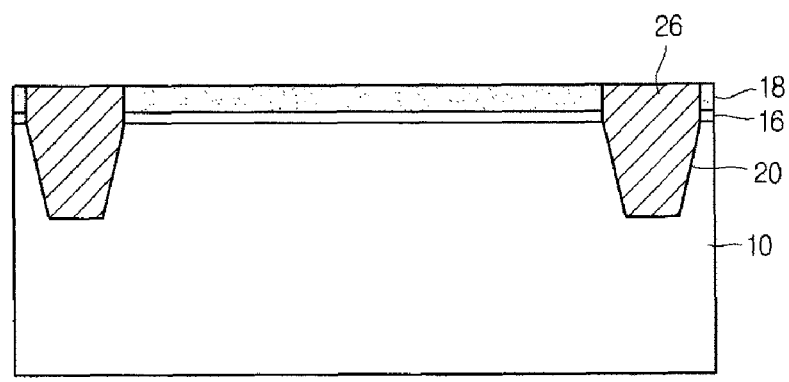

As illustrated in example FIG. 8, insulating material may then be buried in trench 20 and formed with first dielectric film pattern 24 to form device isolation film pattern 26. Device isolation film pattern 26 may be formed by forming a second dielectric film on and/or over first dielectric film pattern 24 and then performing a planarization process thereon. The second dielectric film is formed on and/or over semiconductor substrate 10 and then the planarization process is performed using first nitride film pattern 18 as an endpoint.

Figure 9:
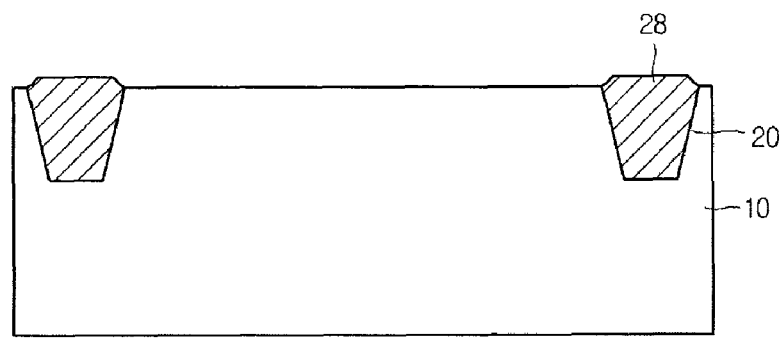

As illustrated in example FIG. 9, first gate oxide film pattern 16 and first nitride film pattern 18 may then be removed, completing formation of device isolation film 28. When first gate oxide film pattern 16 and first nitride film pattern 18 are removed, a portion of exposed device isolation film pattern 26 may also be removed. After forming first dielectric film 22 on and/or over trench 20, the aspect ratio may be increased by being subject to the wet etching process to gap fill trench 20 without voids when forming the subsequent second dielectric film, making it possible to complete formation of device isolation film 28.

Figure 10:
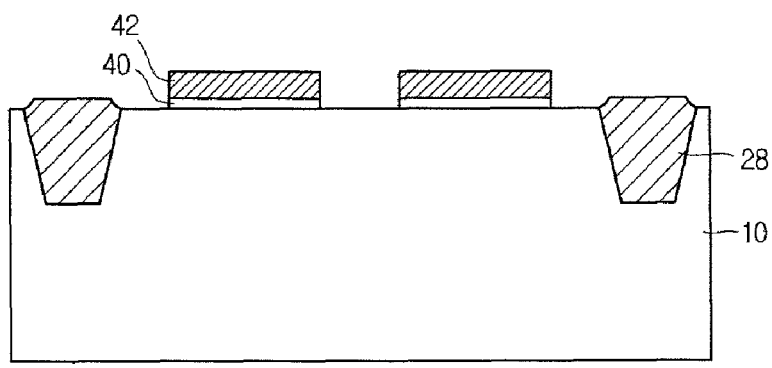

As illustrated in example FIG. 10, a second gate oxide film and a floating gate layer may then be sequentially formed on and/or over semiconductor substrate 10 and then patterned to form second gate oxide film pattern 40 and floating gate pattern 42. Second gate oxide film pattern 40 may be formed at a thickness in a range between 85 Å to 95 Å, preferably at a thickness of 90 Å. Floating gate pattern 42 may be composed of polysilicon.

Figure 11:
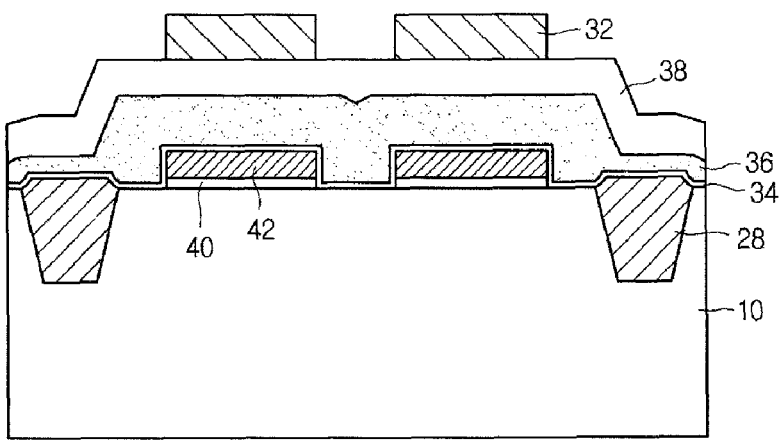

As illustrated in example FIG. 11, dielectric film 34, control gate 36 and hard mask 38 may then be sequentially formed on and/or over semiconductor substrate 10 formed with second gate oxide film pattern 40 and floating gate pattern 42. And, after photoresist pattern 32 is formed on and/or over hard mask 38, a first hard mask pattern may be formed by etching hard mask 38. Photoresist pattern 32 may then be removed. Control gate 36 may be made of polysilicon. Dielectric film 34 may be formed in an oxide-nitride-oxide (ONO) structure to function to insulate floating gate 32 from control gate 36. Hard mask 38 may be formed of tetra ethyl ortho silicate (TEOS) at a thickness in a range between 2000 to 2200 Å.

Figure 12:
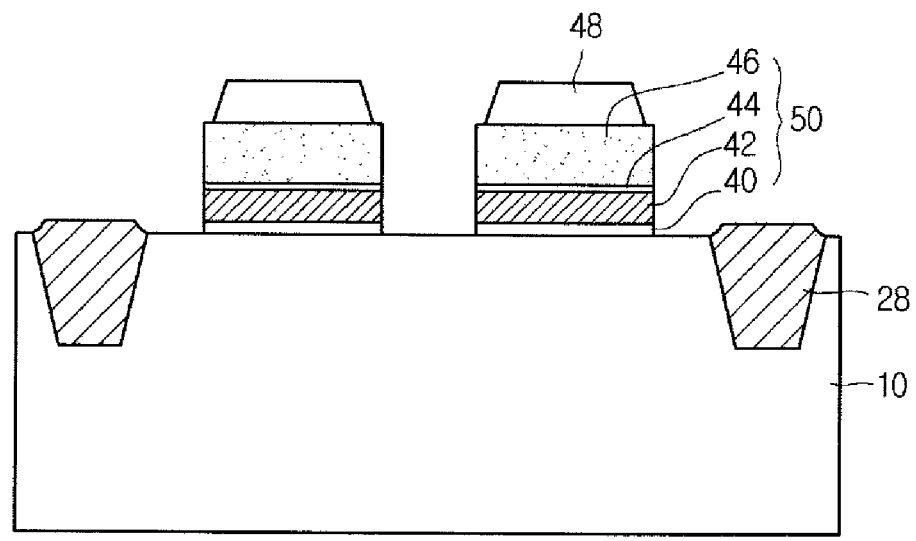

As illustrated in example FIG. 12, an etching process may then be performed using the first hard mask pattern as a mask, thereby forming gate 50 on and/or over semiconductor substrate 10 and includes second gate oxide film pattern 40, floating gate pattern 42, dielectric film pattern 44 and control gate pattern 46. A portion of the first hard mask pattern may also be etched to form second hard mask pattern 48 on and/or over control gate pattern 46. In a typical process of forming a gate, a margin of photoresist thickness is insufficient, and thus, embodiments herein patterns the gate using the first hard mask pattern. Floating gate 42 may serve to store data while control gate 46 may function to apply bias voltage exciting electrons to floating gate 42 formed on the lower thereof to charge or discharge them.

Figure 13:
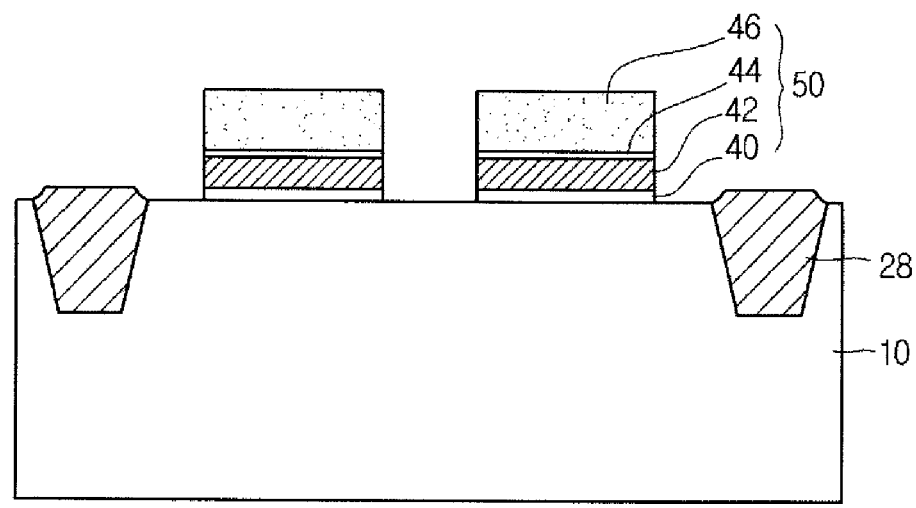

As illustrated in example FIG. 13, second hard mask pattern 48 may then be removed by performing a vapor phase cleaning process using hydrogen fluoride (HF) solution. If dielectric film pattern 44 is damaged when removing second hard mask pattern 48, it affects the cell properties. Therefore, the vapor phase cleaning process may be performed to remove second hard mask pattern 48 without damaging dielectric film pattern 44. The vapor phase cleaning process may be performed at a temperature of 39° C. for between 10 to 20 seconds.

Figure 14:
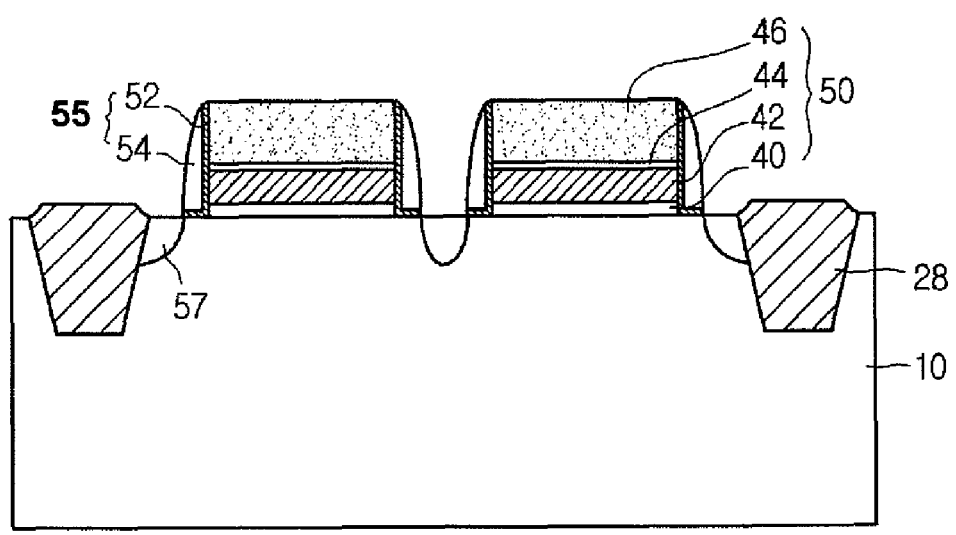

As illustrated in example FIG. 14, first spacer 55 that includes second nitride film pattern 54 and first oxide film pattern 52 may then be formed on sidewalls of gate 50. An ion implant process using gate 50 and first spacer 55 as ion implant masks may then be performed on semiconductor substrate 10 to form source/drain area 57 having a high concentration impurity area. First spacer 55 may be formed by forming a second nitride film and a first oxide film on and/or over semiconductor substrate 10 formed with gate 50 and then performing a dry etching process thereon. The first oxide film may be made of TEOS having a thickness in a range between 150 to 250 Å and the second nitride film may be made of silicon nitride (SiN) having a thickness in a range between 770 to 1500 Å.

Figure 15:
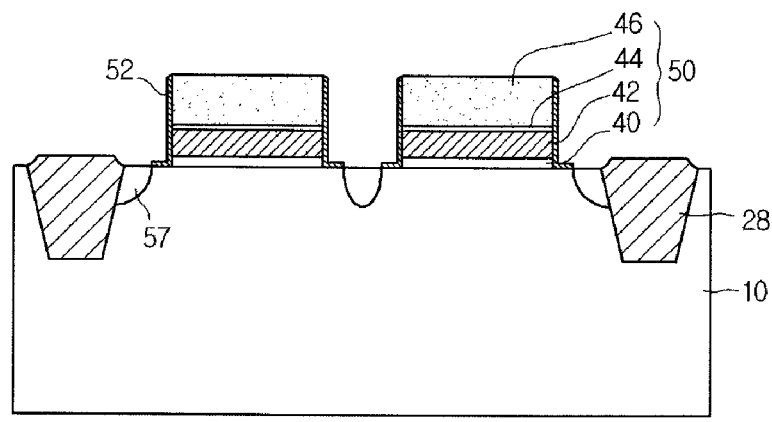

As illustrated in example FIG. 15, second nitride film pattern 54 may then be removed. As second nitride film pattern 54 is removed, a sufficient spatial interval between gates 50 formed on and/or over the cell area can be secured before forming an interlayer dielectric film. Therefore, void generation can be prevented when subsequently forming the interlayer dielectric film. Furthermore, a process margin for forming a contact later is sufficiently secured and a spatial interval between gates 50 is reduced in accordance with the thickness of the removed second nitride film pattern 54. Increased integration of the device is a result. Second nitride film pattern 54 may be removed by proceeding with a wet etching process using phosphoric acid ($H_3PO_4$).

Figure 16:
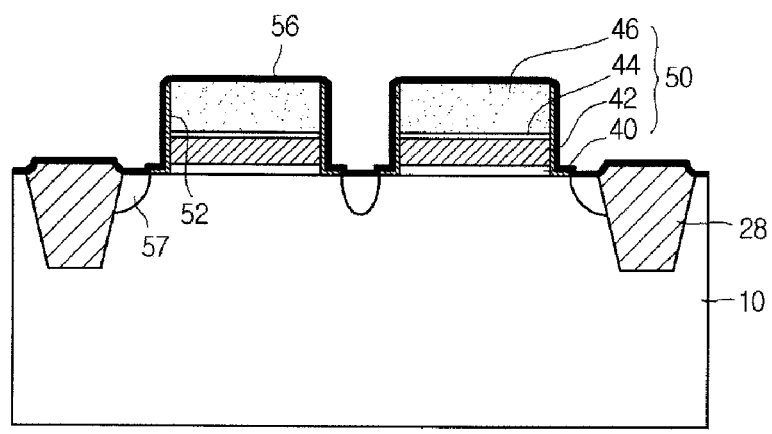

As illustrated in example FIG. 16, third nitride film 56 may then be formed on and/or over semiconductor substrate 10. Third nitride film 56 may be made of silicon nitride (SiN) having a thickness in a range between 180 to 220 Å. Third nitride film 56 may function to prevent a generation of abnormal device property resulted from a subsequent formation of a salicide on and/or over first oxide film pattern 52 remaining on sidewalls of the gate 50 through a salicide process. Since there is a process limit in controlling a predetermined amount of nitride film to be maintained during the process removing second nitride film pattern 52, it is a more stable method to perform a re-deposition in a subsequent process.

Figure 17:
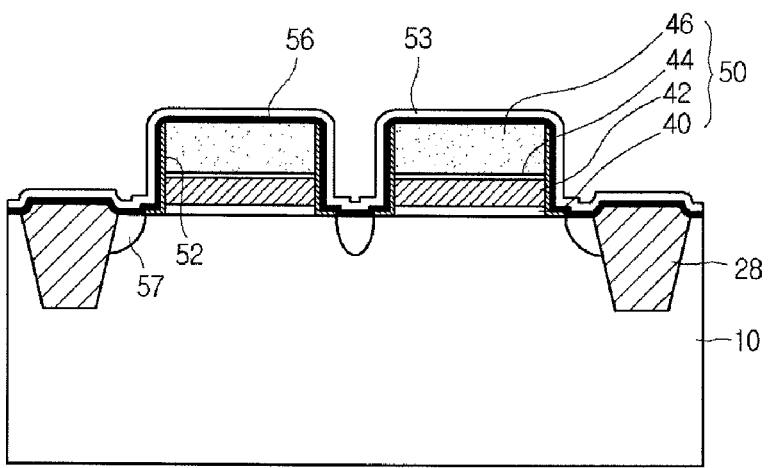

As illustrated in example FIG. 17, second oxide film 53 may then be formed on and/or over third nitride film 56. Second oxide film 53 may be made of TEOS having a thickness of between 300 to 500 Å, preferably, a thickness of 400 Å.

Figure 18:
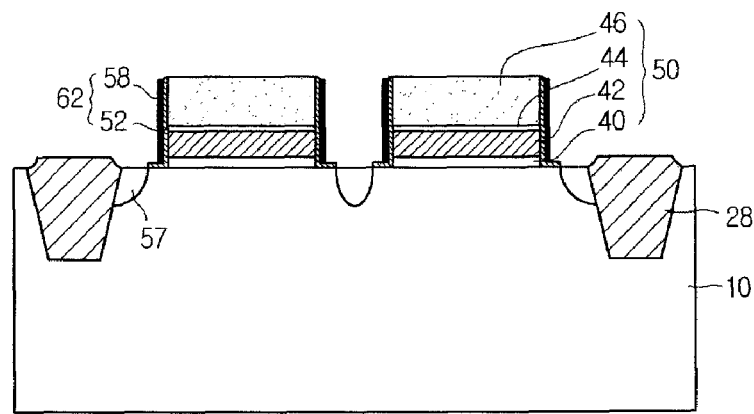

As illustrated in example FIG. 18, second oxide film 53 may then be removed through an etching process to form third nitride film pattern 58 on the sidewalls of first oxide film 52. When removing second oxide film 53, a portion of third nitride film 56 formed on and/or over control gate 46 and semiconductor substrate 10 may be removed so that third nitride film pattern 58 remains only on and/or over sidewalls of first oxide film pattern 52. Therefore, second spacer 62 configured of oxide film pattern 52 and third nitride film pattern 58 may be formed on and/or over sidewalls of gate 50. First oxide film pattern 52 also does not form into a silicide during a subsequent salicide process.

Figure 19:
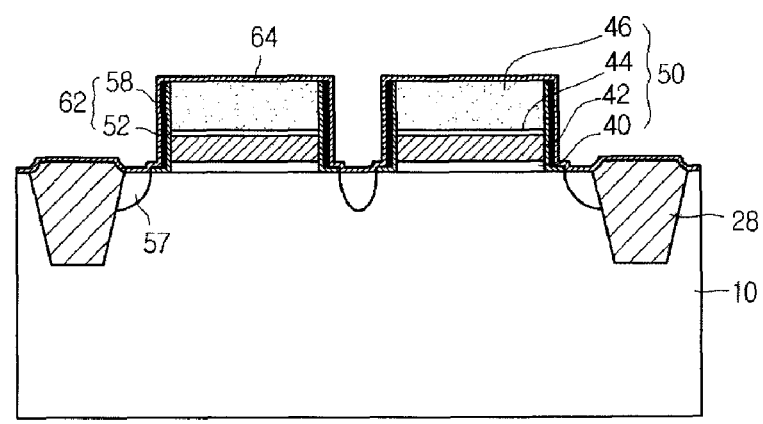

As illustrated in example FIG. 19, silicide-forming metal 64 may then be deposited on and/or over semiconductor substrate 10. Silicide-forming metal 57 may be made of cobalt (Co).

Figure 20:
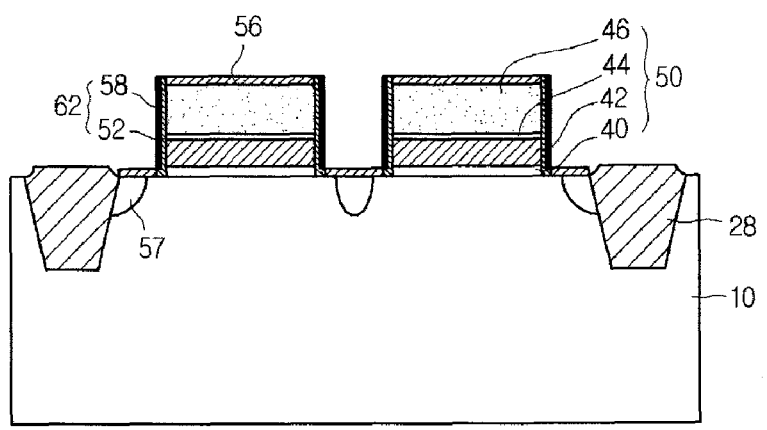

As illustrated in example FIG. 20, an annealing process or thermal process may then be performed on and/or over semiconductor substrate 10 to induce a reaction between silicon and metal 57, thereby forming metal silicide 56 on and/or over gate 50 and source/drain region 57, respectively. Through the annealing process, the metal silicide is formed only on and/or over areas where metal contacts silicon and polysilicon. Metal silicide is not formed, however on and/or over other areas since a reaction between metal and silicon is blocked. After simultaneously forming metal silicide 56 on and/or over gate 50 and source/drain area 57, silicide-forming metal 64 not reacted may be removed through a selective etching.

Figure 21:
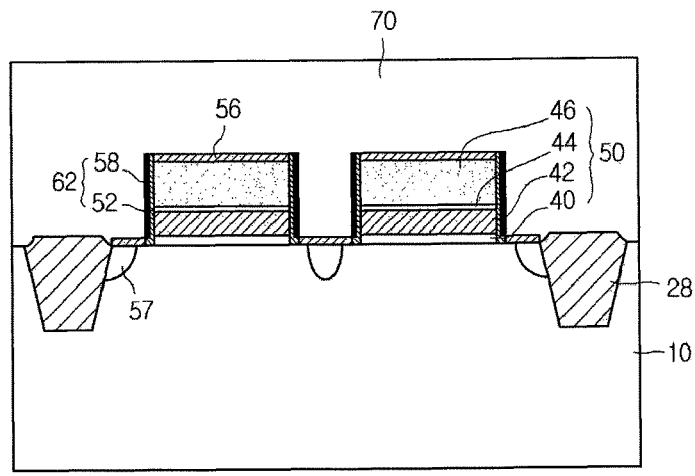

As illustrated in example FIG. 21, interlayer dielectric film 70 may then be formed on and/or over semiconductor substrate 10. Interlayer dielectric film 70 may be a pre-metal dielectric (PMD) film, and composed of phosphorus silicate glass (PSG), boro-phorphorus silicate glass (BPSG) or undoped silicate glass (USG). In accordance with embodiments, a sufficient space between gates 50 may be secured by removing second nitride film pattern 54 of first spacer 56 to prevent void generation when forming interlayer dielectric film 70. After forming a via hole by selectively etching interlayer dielectric film 70, a metal such as tungsten (W) may then be buried in the via hole to form a contact plug. Contact plug may be electrically contacted to gate 50 and source/drain area 57. Since voids are not generated when forming interlayer dielectric film 70, a diffusion phenomenon due to voids is in turn not generated when forming the contact plug so that a flash memory device can perform a normal operation. Also, after the tungsten contact plug is formed, a bridge between devices due to the void can be prevented. As described above, a method of manufacturing a flash memory device in accordance with embodiments secures a sufficient space between gates, making it possible to prevent a generation of voids when forming an interlayer dielectric film.

Example FIGS. 22 to 29 are experimental results drawing optimal cell property through process experiments affecting cell property. As a basic operation of a NOR flash cell, there are a program operation and an erase operation. The program operation, which is an operation injecting hot electrons generated around a drain into a floating gate, uses a channel hot electron injection method. The program operation may be made on the condition that if 10 V is applied to control gate 46, 3.9 V may be applied to a drain, and 0V may be applied to a source and a bulk substrate for 3 µs. A portion of the channel hot electrons may be injected to floating gate 42 through tunnel oxide 40, that is a gate oxide film, by a gate electric field. The erase operation erases data by the source and the bulk substrate using a Fowler-Nordheim (FN) tunneling method. In other words, the drain is floated, −9.1 V may be applied to control gate 46 and 7.7V may be applied to the source and the bulk for 100 ms time to draw out charge accumulated on floating gate 42 to the source and the bulk substrate. Under such a voltage condition, program target threshold voltage is 8V and erase threshold voltage is 1.5V. The experimental results to be explained later are drawn, conforming to the operation condition proposed above. Hereinafter, the experimental result will be described with reference to the accompanying drawings.

Figure 22:
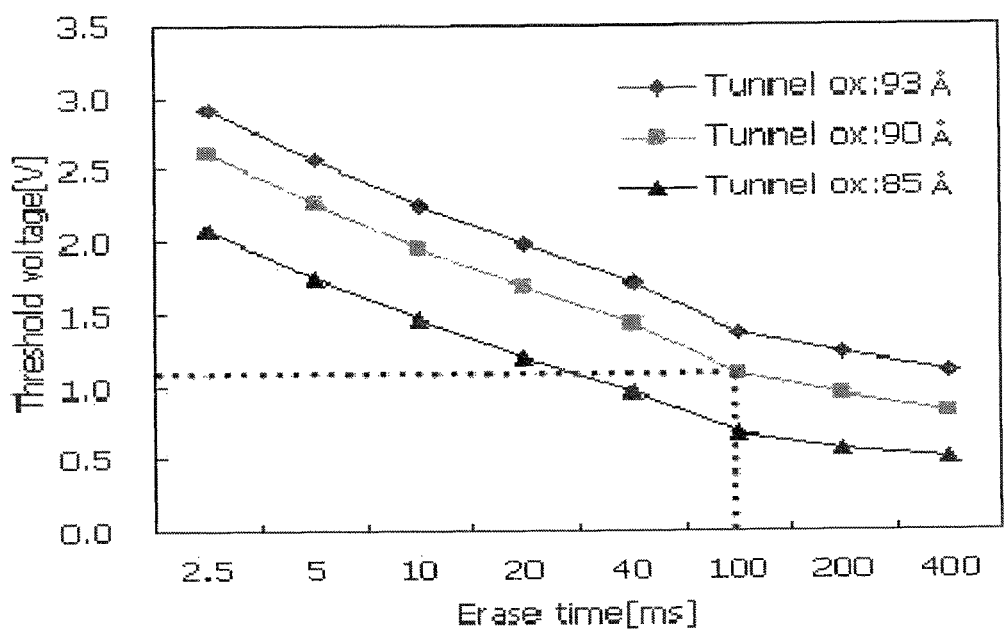

As illustrated in example FIG. 22, an experimental result on erase property of tunnel oxide film 40 is provided. A first process parameter affecting cell property is a thickness of tunnel oxide film 40. Tunnel oxide film 40, which is an oxide film formed between floating gate 42 and cell active area, affects erase property of the cell. When a very high electric field is applied to tunnel oxide film 40, a tunneling occurs on a conductor on the oxide film from an electrode so that in case FN current, charge in floating gate 42 may be more easily drawn down, as the thickness of the oxide film becomes thinner. As illustrated in example FIG. 22, it may be appreciated that the erase threshold voltage becomes lower, as the thickness of tunnel oxide film 40 is reduced. Therefore, in accordance with embodiments, a thickness of 90 Å may be used in order to set the erase threshold voltage of 1.5V for 100 ms. Through such a selection, the erase threshold voltage can be set to about 1.2V for 100 ms, as shown in example FIGS. 28 and 29.

Figure 23:
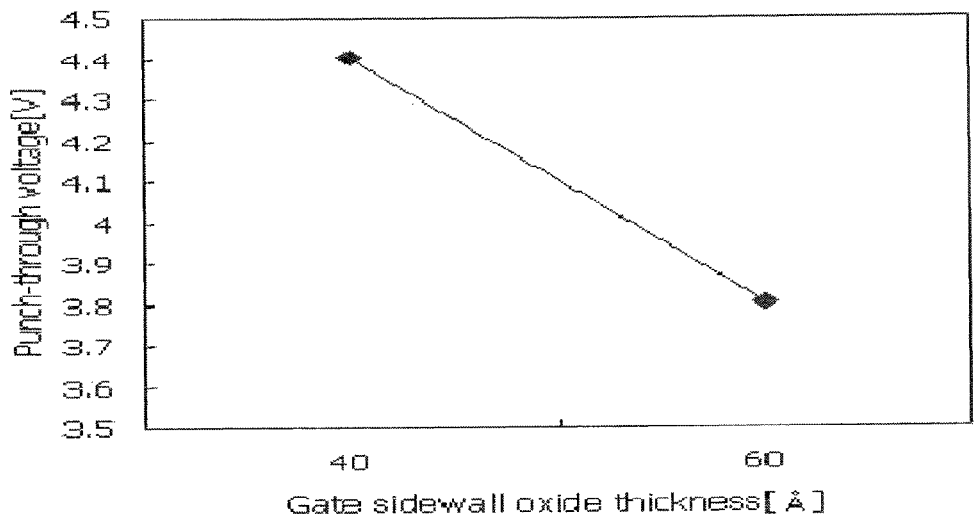
Figure 24:
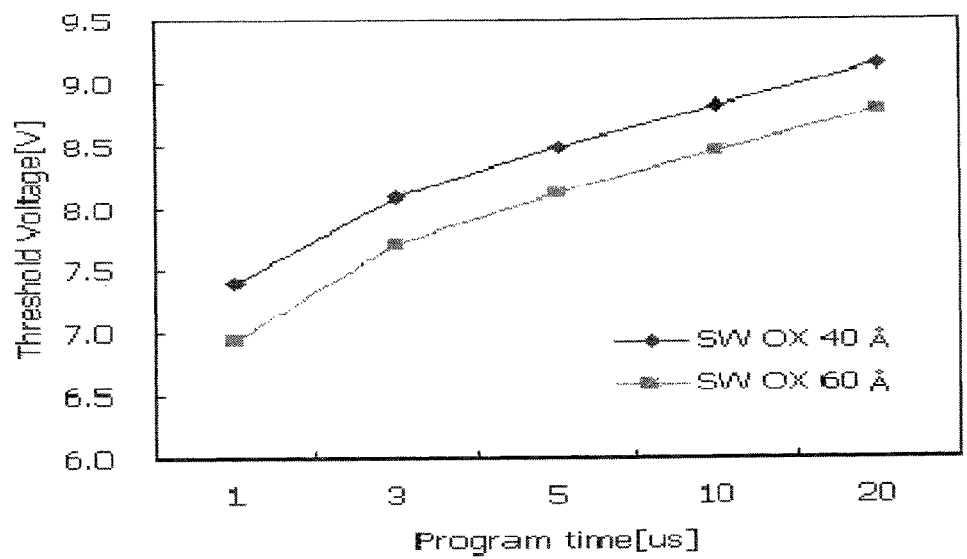
Figure 25:
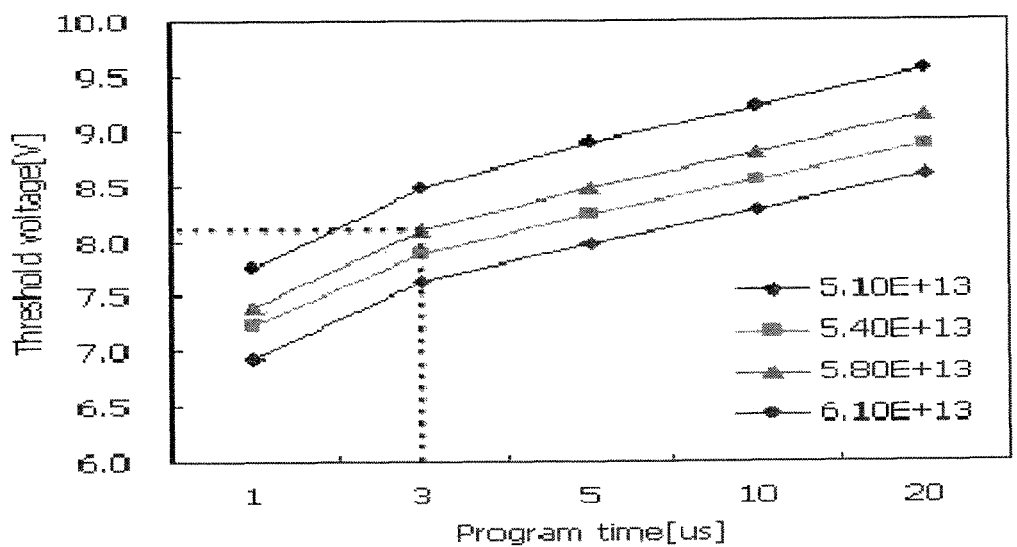

As illustrated in example FIG. 23, an experimental result on punch-through property according to a thickness of sidewall oxide 52 is provided. Example FIG. 24 is an experimental result on program property according to a thickness of sidewall oxide 52. As shown in example FIG. 23, if a thickness of sidewall oxide film 52 is reduced from 60 Å to 40 Å, a spread of a junction between the source and the drain to sides is prevented due to short temperature time, making it possible to improve the punch-through property. As illustrated in example FIG. 24, it can be appreciated that the program threshold voltage is increased by about 0.3V Illustrated in example FIG. 25 is an experimental result on program property according a channel doping. As shown in example FIG. 25, it can be appreciated that as a channel doping of boron is higher, current of a cell is increased to increase program threshold voltage. As the experimental result, a 5.8E13 dose condition having threshold voltage of 8V at 3 us is selected. Consequently, through the process experiments affecting the cell property, the conditions of tunnel oxide film 40 having a thickness of 90 Å, sidewall oxide film 52 having a thickness of 40 Å and the cell threshold voltage ion implant dose of 5.8E13 may be selected.

Figure 26:
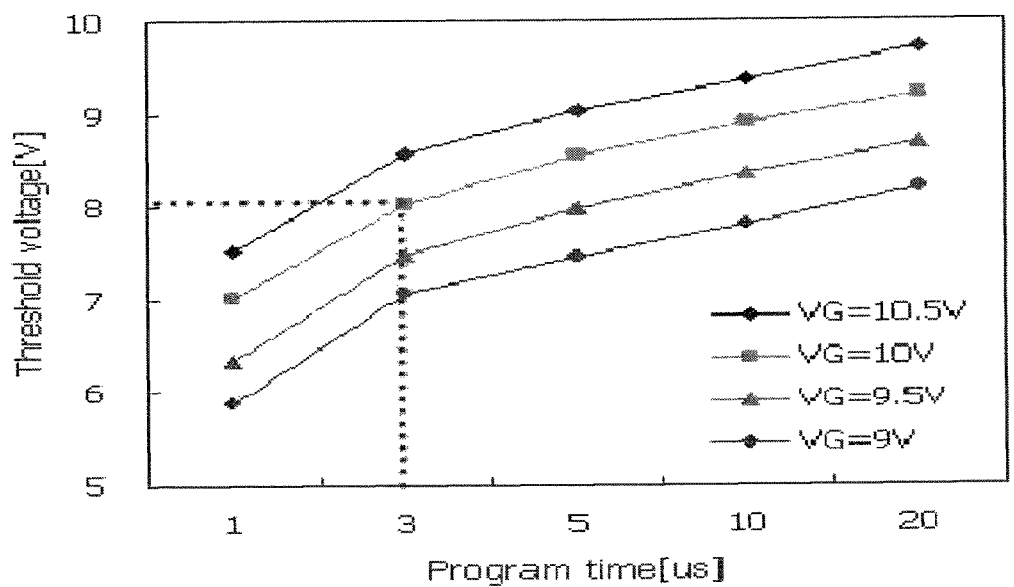
Figure 27:
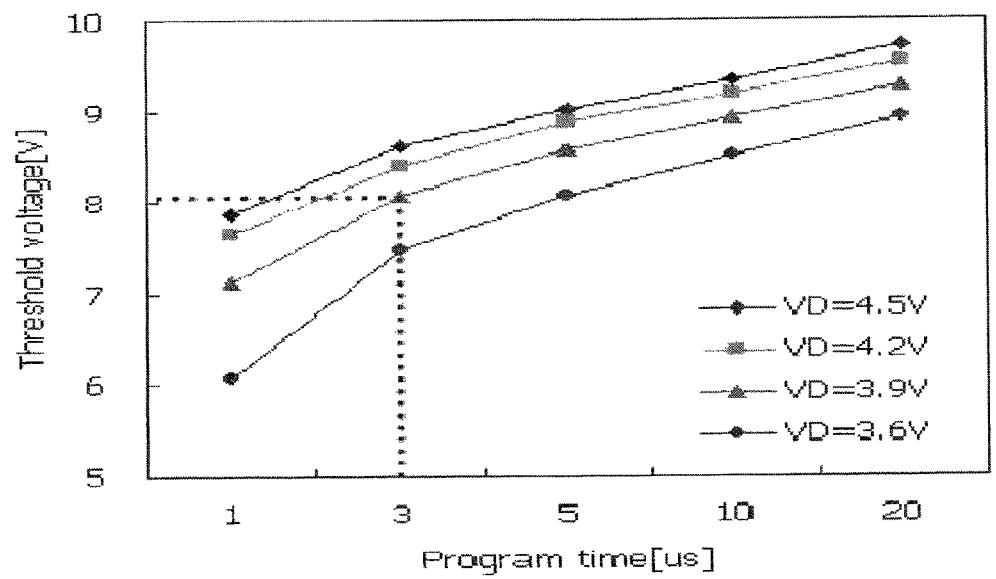

Illustrated in example FIG. 26 is program velocity property according to gate voltage at a drain voltage of 3.9V. Example FIG. 27 illustrates program velocity property according to drain voltage at a gate voltage of 10V. From the two experimental results, it can be appreciated that when the gate voltage is 10V and the drain voltage is 3.9V, the threshold voltage increases to about 8V for 3 µm program time. Also, it can be appreciated that the program velocity property according to change of gate voltage regularly increases, as shown in example FIG. 26. As illustrated in example FIG. 27, it can be appreciated that as the drain voltage becomes higher, the program threshold voltage reduces little by little. Consequently, the program threshold voltage can be improved through increase of the gate voltage rather than increase of the drain voltage. The reason is that since high voltage of gate 50 is exactly applied to floating gate 42 as much as the high voltage due to a coupling ratio to expand the gate electric field, much more hot electrons can be drawn up to floating gate 42.

Figure 28:
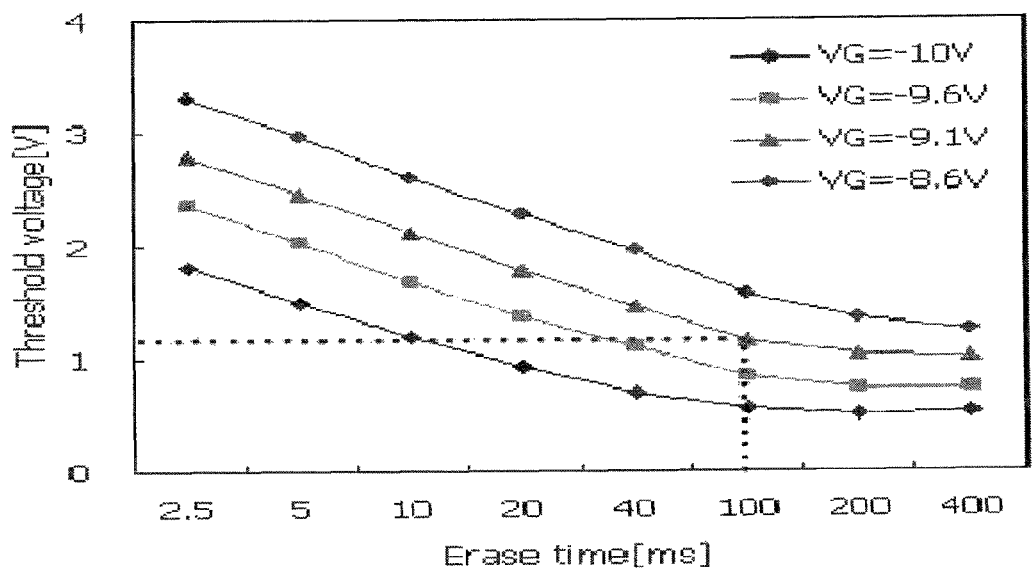
Figure 29:
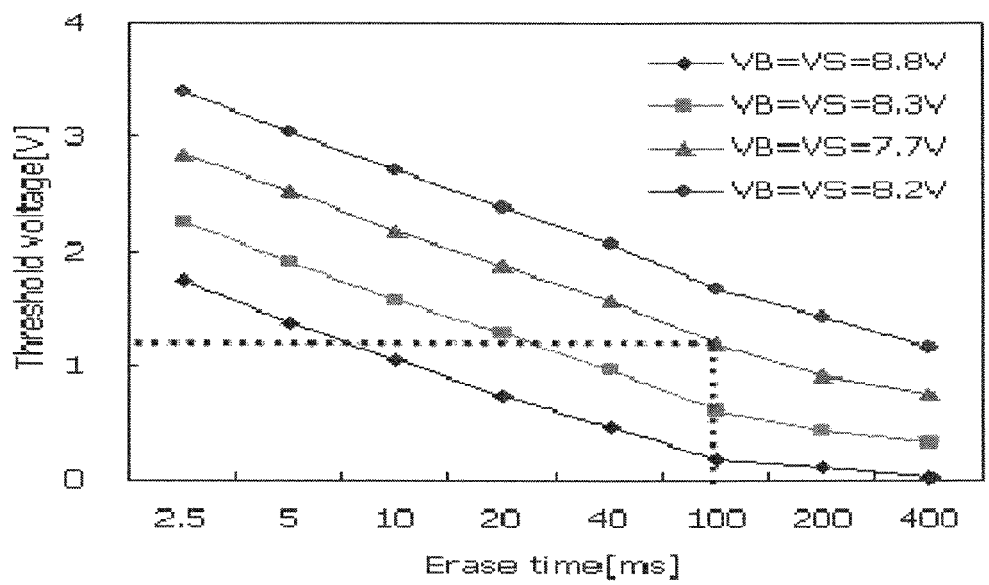

Illustrated in example FIG. 28 is erase velocity property according to gate voltage, applying 7.7 V to a source and a bulk substrate, and FIG. 29 shows erase velocity property according to voltage change of a source and a bulk, applying −9.1V to a gate. It can be appreciated that the two conditions show erase threshold voltage of about 1.2V for 100 ms that is a target erase time, wherein the erase velocity is the same. This is the reason that the erase operation is made according to the electric field by a potential difference between the gate, the source and the bulk.

Example FIGS. 30 to 33 show experimental results testing reliability of a cell. Cell disturbance is a phenomenon that occurs since high electric filed affects non selected cells connected on common drain and gate during successive programming operations. This phenomenon may be divided into a gate disturbance, a drain disturbance, and a read disturbance.

Figure 30:
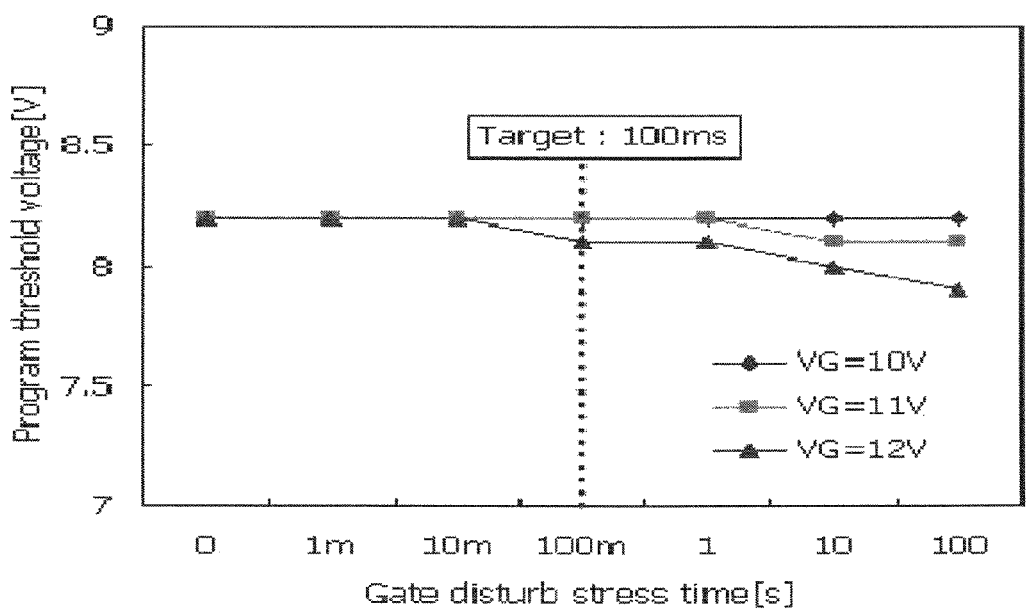

Example FIG. 30 shows property of a gate disturbance. The gate disturbance is a disturbance that occurs when high voltage is applied to a gate of other deleted cell connected to a common gate during a reading operation. This is a disturbance resulted from that the portion of electrons in floating gate 42 of the programmed cell are injected into control gate 46 through ONO insulator 44, and the other electrons are injected into a substrate. As illustrated in example FIG. 30, there is not any reduction in the threshold voltage at the gate voltage of 10V operating the cells during stress time of 100 ms. It can be appreciated that on condition of high voltage that the gate voltage is 12V, the program threshold voltage is reduced by about 0.3V. Also, the reason why the threshold voltage is not abruptly reduced even though the gate voltage stress is applied for a long time, is that it is difficult for the electrons in floating gate 42 to be injected to the control gate through thick ONO insulator 44.

Figure 31:
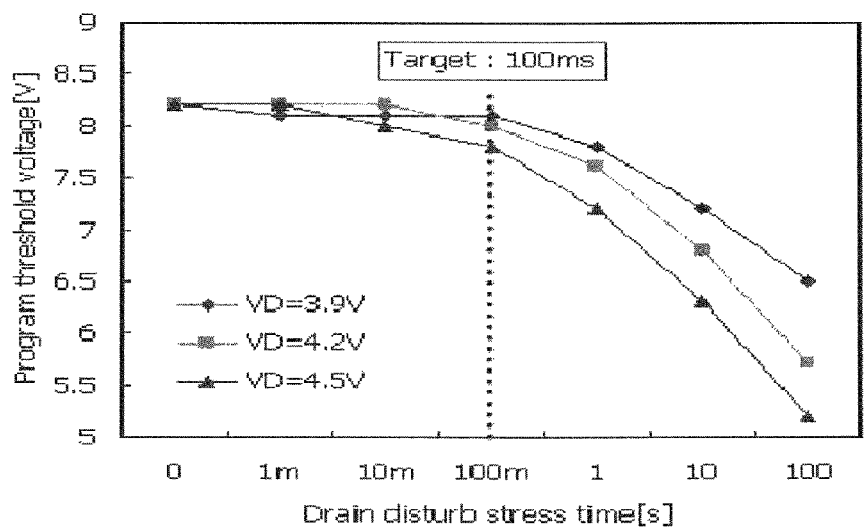

Example FIG. 31 shows property of a drain disturbance. The drain disturbance is a disturbance that occurs in a cell programmed sharing a drain with a cell to be programmed. An electric field occurs between a drain and a gate of a non-selected cell sharing the drain is the cell to be programmed. This is a disturbance resulted from that owing to the electric field, some charges are tunneled from floating gate 42 to the drain to become a cause to lower threshold voltage and some electrons in floating gate 42 of the programmed cell is lost. As shown in example FIG. 31, it can be appreciated that about 0.1 V is reduced at the drain of 3.9V operating the cell for 100 ms time. In view of a margin, although the drain voltage 4.2V is applied, the threshold voltage is reduced only by about 0.2V. Different from the gate disturbance, the drain disturbance has an abrupt threshold reduction property according to stress time. This is the reason that the electrons in the floating gate 42 can easily escape to the drain through a thin tunnel oxide film of thickness between 40 of 90 Å.

Figure 32:
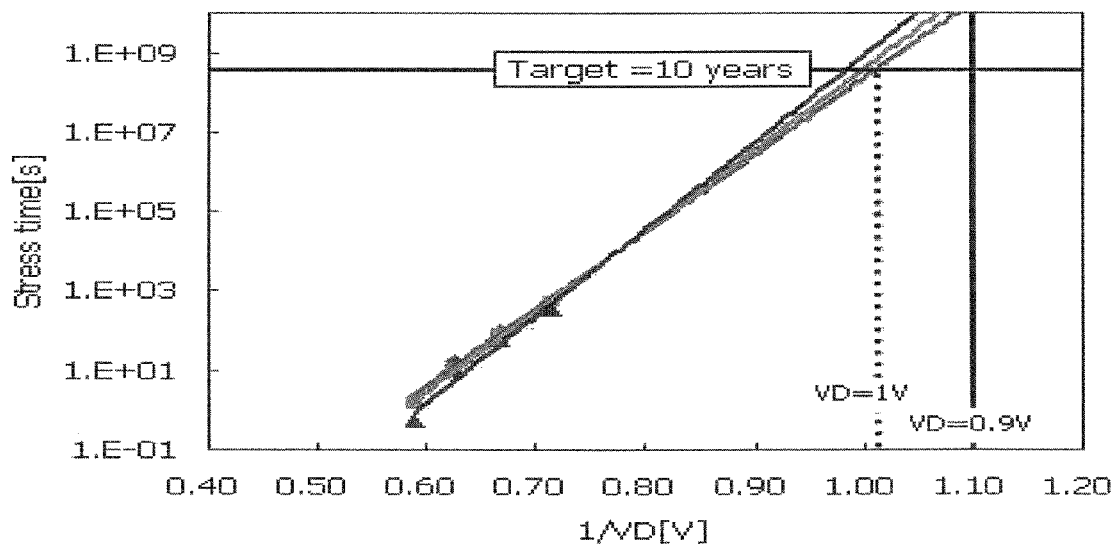

Example FIG. 32 shows property of a read disturbance. The read disturbance is a disturbance that occurs by losing charges in the floating gate when low current is injected during a read operation, resulted from that the charges cannot be maintained for 10 years under the read condition. As shown in example FIG. 32, 10 years may be guaranteed at the drain voltage of 1V. Also, time over 100 years may guaranteed at the drain voltage of 0.9V for a read operation.

Figure 33:
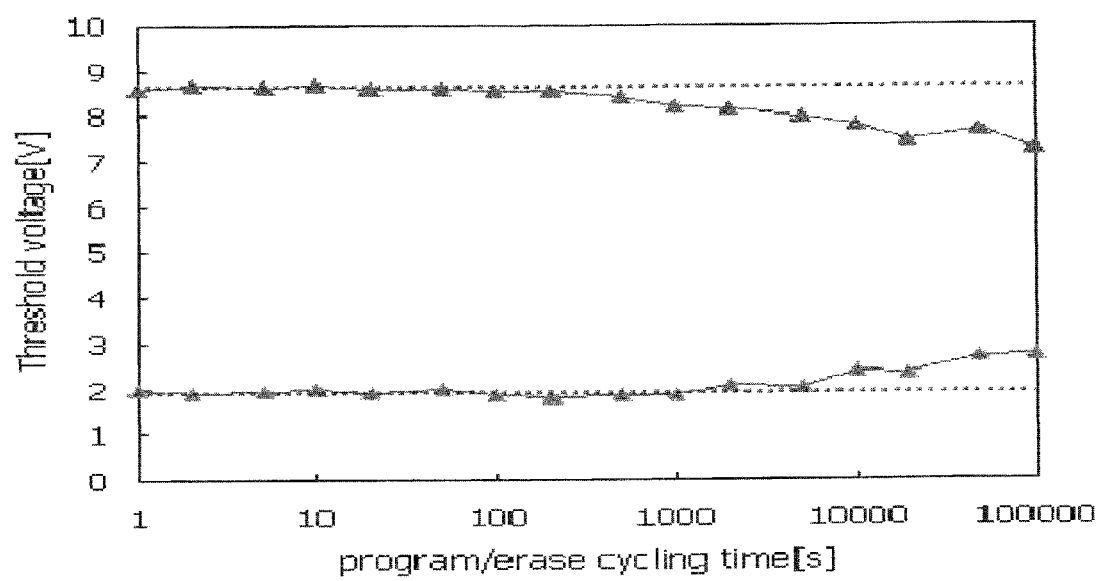

Example FIG. 33 shows endurance property, and shows property of threshold voltage when a program operation and an erase operation are performed over 100,000 times. At the time of programming, when tunnel electrons are flowed from a channel portion to floating gate 42, an electron trap occurs in tunnel oxide film 40. Hole current occurs due to the electron trap and becomes causes of various disturbances, such that it affects reliability of a flash memory. In other words, it can be appreciated that FN current hardly flows owing to the electron trap in the oxide film, thereby the number of program/erase cycles increases so that a window of the threshold voltage becomes narrow. As illustrated in example FIG. 33, the window of the threshold voltage becomes narrow little by little when the program/erase is over 1000 times. However, as a cycle result of 100,000 times cycle that is an evaluation criteria for reliability, it can be appreciated that the window reduction of about 2 V is within the evaluation criteria for reliability.

In accordance with embodiments, as the experimental results of the cell property, an optimal process condition is applied through tunnel oxide film 40, sidewall oxide film 52 and the cell channel doping experiment, that are processes affecting the cell property. Also, under the process condition of a 90 nm flash memory device, margins for the cell program, the erase velocity property, and the punch-through property are confirmed. Thereby, the 90 nm cell property secures the property of the disturbance of the 90 nm flash memory cell and the reliability property thereof, despite the reduction by 49% in the size of the 130 nm cell. Therefore, owing to the reduction in the cell size, the technique on the 90 nm flash memory increase the mass-production of a chip, making it possible to increase the sales thereof.

A method of manufacturing a flash memory device in accordance with embodiments can prevent a generation of void when forming a device isolation film and can prevent a generation of void when forming an interlayer dielectric film.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a first oxide film pattern and a first polysilicon pattern on a semiconductor substrate;
    sequentially forming a dielectric film and a polysilicon film on the semiconductor substrate including the first oxide film pattern and the first polysilicon pattern;
    forming a second oxide film pattern on the polysilicon film;
    forming a gate by etching to the semiconductor substrate using the second oxide film pattern as a mask, the gate including the first oxide film pattern, the first polysilicon pattern, a dielectric film pattern and a second polysilicon pattern;
    removing the second oxide film pattern;
    forming a spacer on sidewalls of the gate; and
    forming an interlayer dielectric film on the semiconductor substrate including the gate and the spacer,
    wherein forming the spacer comprises:
        forming a third oxide film and a first nitride film on the sidewalls of the gate;
        forming a third oxide film pattern and a first nitride pattern on the sidewalls of the gate by performing a dry-etching process on the third oxide film and the first nitride film;
        removing the first nitride film pattern;
        forming a second nitride film on the semiconductor substrate including the third oxide film pattern and the gate;
        forming a fourth oxide film on the second nitride film; and
        forming a second nitride film pattern by performing an etching process on the fourth oxide film.

2. The method of claim 1, wherein the second oxide film pattern is made of TEOS.

3. The method of claim 1, wherein the second oxide film pattern is removed using hydrogen fluoride (HF) solution.

4. The method of claim 1, wherein the second oxide film pattern is removed through a vapor phase cleaning process.

5. The method of claim 4, wherein the vapor phase cleaning process is performed at a temperature of 39° C.

6. The method of claim 4, wherein the vapor phase cleaning process is performed for 10 to 20 seconds.

7. The method of claim 1, wherein the second oxide film pattern is formed at a thickness in a range between 2000 to 2200 Å.

8. The method of claim 1, wherein the spacer comprises the third oxide film pattern and the second nitride film pattern.

9. The method of claim 1, wherein the third oxide film is formed at a thickness in a range between 150 to 250 Å.

10. The method of claim 1, wherein the first nitride film is formed at a thickness in a range between 770 to 1500 Å.

11. The method of claim 1, wherein the second nitride film is formed at a thickness in a range between 180 to 220 Å.

12. The method of claim 1, further comprising, before forming the interlayer dielectric film and after forming the spacer:

depositing a silicide-forming metal over the overall surface of the semiconductor substrate including the gate and the spacer; and then forming a metal silicide layer on the gate by performing an annealing process on the semiconductor substrate including the silicide-forming metal.

13. The method of claim 12, wherein the silicide-forming metal comprises cobalt.

* * * * *